(12) United States Patent
Vos et al.

(10) Patent No.: US 7,489,488 B2
(45) Date of Patent: Feb. 10, 2009

(54) INTEGRATED CIRCUIT PROVIDING OVERVOLTAGE PROTECTION FOR LOW VOLTAGE LINES

(75) Inventors: Chad A. Vos, Dallas, TX (US); Kelly C. Casey, Flower Mound, TX (US)

(73) Assignee: Littelfuse, Inc., Des Plaines, IL (US)

( * ) Notice: Subject to any disclaimer, the term of this patent is extended or adjusted under 35 U.S.C. 154(b) by 173 days.

(21) Appl. No.: 11/254,164

(22) Filed: Oct. 19, 2005

(65) Prior Publication Data
US 2007/0086129 A1 Apr. 19, 2007

(51) Int. Cl.
H02H 9/00 (2006.01)
(52) U.S. Cl. .................................................. 361/91.5
(58) Field of Classification Search .................. 361/91.5
See application file for complete search history.

(56) References Cited

U.S. PATENT DOCUMENTS

| | | | |
|---|---|---|---|
| 3,609,512 A | | 9/1971 | Lewis |
| 3,619,739 A | * | 11/1971 | Camenzind et al. .......... 257/527 |
| 3,978,514 A | | 8/1976 | Ogawa et al. |
| 3,982,268 A | | 9/1976 | Anthony et al. |
| 4,612,564 A | * | 9/1986 | Moyer .......................... 257/666 |
| 4,860,083 A | * | 8/1989 | Kojo ............................ 257/516 |
| 5,008,602 A | * | 4/1991 | Stevens et al. ............... 318/561 |
| 5,326,994 A | * | 7/1994 | Giebel et al. ................. 257/174 |
| 5,422,947 A | * | 6/1995 | Azem ........................... 379/396 |
| 5,539,820 A | | 7/1996 | Pistilli |
| 6,075,277 A | * | 6/2000 | Pezzani ........................ 257/499 |
| 6,259,123 B1 | * | 7/2001 | Kelberlau et al. ............ 257/107 |
| 6,421,220 B2 | | 7/2002 | Kobsa |
| 6,580,789 B1 | * | 6/2003 | Simpson et al. .......... 379/114.02 |
| 6,628,497 B1 | | 9/2003 | Napiorkowski et al. |
| 6,777,726 B2 | | 8/2004 | Tihanyi |
| 6,876,742 B1 | | 4/2005 | Sacca |
| 6,954,347 B1 | | 10/2005 | Chaudhry |
| 7,224,052 B2 | | 5/2007 | Nishizawa et al. |
| 7,266,195 B1 | * | 9/2007 | Dupuis et al. ................ 379/412 |
| 2004/0070050 A1 | * | 4/2004 | Chi .............................. 257/536 |
| 2004/0188818 A1 | | 9/2004 | Wang |
| 2006/0181833 A1 | * | 8/2006 | Brown et al. ................. 361/124 |

OTHER PUBLICATIONS

Ya-Chin King et al. Punch Through Transient Voltage Suppressor For Low-Voltage Electronics IEEE Electron Device Letters, vol. 16 No. 7, Jul. 1995, pp. 303-305 http://ieeexplore.ieee.org/iel1/55/8822/00388715.pdf?arnumber=388715.*

Ya-Chin King et al. Punch Through Transient Voltage Suppressor For Low-Voltage Electronics IEEE Electron Device Letters, vol. 16 No. 7, Jul. 1995, pp. 303-305 http://ieeexplore.ieee.org/ie1/155/8822/00388 715.pdf?arnumber=388715.*

(Continued)

*Primary Examiner*—Stephen W Jackson
(74) *Attorney, Agent, or Firm*—Roger N. Chauza P.C.

(57) ABSTRACT

An overvoltage protection circuit for protecting low voltage, high speed digital communication lines. The circuit is integrated into a semiconductor chip and includes a diode bridge, a transient voltage suppressor (TVS) device and resistors through which a bias voltage can be applied to the TVS device to reduce the capacitance hereof.

21 Claims, 6 Drawing Sheets

OTHER PUBLICATIONS

Teccor Electronics P3002SB Device, Top and Bottom Assembly View (undated).
Teccor Electronics B1xx1UA4 6-pin Device, Top and Side Assembly View (undated).
Littelfuse, Inc., SP721 TVS Doiode Arrays, (undated).
Semtech Product Brochure, Low Cap. 3.3 Volt TVS, type LC3-3.3, Oct. 14, 2004.
Office Action in U.S. Appl. No. 11/254,162, dated Apr. 8, 2008.
Office Action in U.S. Appl. No. 11/254,163, dated Jan. 22, 2008.

* cited by examiner

INTEGRATED CIRCUIT PROVIDING OVERVOLTAGE PROTECTION FOR LOW VOLTAGE LINES

RELATED APPLICATIONS

This non-provisional patent application is related to U.S. patent application entitled "Linear Low Capacitance Overvoltage Protection Circuit" by Kelly C. Casey, Appl. No 11/254,162, filed on even date herewith. This non-provisional patent application is also related to U.S. patent application entitled "Stacked Integrated Circuit Chip Assembly" by Chad A. Vos, Appl. No. 11/254,163, filed on even date herewith.

TECHNICAL FIELD OF THE INVENTION

The present invention relates in general to integrated circuit chips, and more particularly to integrated circuits providing overvoltage protection to high speed lines.

BACKGROUND OF THE INVENTION

Communication lines are employed to transmit digital and analog communication signals between remote locations. Because communication lines may be exposed to damaging voltages, such as lightning, electrostatic discharges, power line and other voltages, such lines are often equipped with circuits providing overvoltage protection thereto. Primary overvoltage protection devices include gas discharge tubes which limit large voltages to smaller amplitudes. Secondary protection devices include solid state devices which further limit the damaging voltages to safe levels so as not to damage integrated circuits, semiconductor devices and other electrical components.

Overvoltage protection devices of the semiconductor type are well adapted for protecting down stream communication circuits from surge and other transient voltages which would otherwise damage or destroy the down stream circuits. Transient voltage suppressors (TVS) are readily available for use as overvoltage protection devices. Many semiconductor devices are well adapted for providing overvoltage protection against voltages greater than, for example, one hundred volts. The doping levels in such integrated circuits are easily attainable to provide a breakover or reverse breakdown voltage of such magnitude. These higher breakover voltage devices are generally two-terminal, four layer devices, such as Sidactor® overvoltage protection devices, obtainable under the Teccor brand, from Littelfuse, Des Plaines, Ill. Other two-terminal avalanche junction devices are well adapted for providing protection to low voltage communication lines, such as Ethernet lines.

Overvoltage protection circuits used in conjunction with communication lines may include a semiconductor device providing overvoltage protection functions, or similar devices in combination with other circuits, such as a bridge, for accommodating overvoltages of either polarity. When overvoltage protection devices and corresponding circuits are used to protect low voltage, high speed communication lines, the capacitance of the protection devices and circuits must be very low. Otherwise, the capacitance of the overvoltage protection devices and corresponding circuits can load the communication line to the extent that the bandwidth is limited, thereby compromising the transmission speed of the line.

It is a common practice to provide overvoltage protection devices and circuits in a single package. If, for example, a TVS device is employed with a diode bridge, then the common practice is to solder the TVS device to a lead frame, together with the individual diodes of the bridge, and encapsulate the components together into one package. Sometimes the diode bridge comprises two separate chips, because it is easier to construct one set of diodes in a P-type substrate and the other set of diodes in a separate N-type substrate.

In a typical integrated circuit package employing multiple components, it is a conventional practice to mount the components separately and provide interconnections between the components using wires bonded to the contact pads or terminals of the component devices. The contact pads of one or more of the components can be soldered to the leads of the metallic lead frame. The assembly then undergoes a molding process where a liquified material is injected into a mold which, when solidified, provides mechanical protection to the lead frame and components attached thereto.

Insofar as many users employ hundreds to thousands of communication lines, there is a need for a miniature, cost effective, packaged overvoltage protection device. It can also be seen that a need exists for a single-chip integrated circuit which includes an overvoltage protection device together with a diode bridge fabricated in the same semiconductor substrate. Another need exists for an overvoltage protection integrated circuit providing overvoltage protection functions to a high speed, low voltage communication line. Yet another need exists for an overvoltage protection circuit having provisions for applying a voltage bias thereto for lowering the junction capacitance of the overvoltage protection device.

SUMMARY OF THE INVENTION

In accordance with the principles and concepts of the invention, disclosed is an integrated overvoltage protection circuit adapted for protecting low voltage, high speed communication lines from overvoltages. The overvoltage protection circuit incorporates a solid state transient voltage suppressor to which a bias voltage is applied to lower the junction capacitance thereof. The overvoltage protection device includes, in a preferred embodiment, a unidirectional TVS device connected to a diode bridge.

In accordance with one embodiment of the invention, disclosed is an overvoltage protection circuit which includes a first pair of diodes with cathodes thereof connected together to form a first circuit junction, and a second pair of diodes with anodes thereof connected together to form a second circuit junction. The first and second pairs of diodes define a bridge circuit. Further included is an overvoltage protection device connected between the first circuit junction and the second circuit junction. The first and second diode pairs, and the overvoltage protection circuit, are formed in a semiconductor chip.

In accordance with another embodiment of the invention, disclosed is an overvoltage protection circuit, which includes a semiconductor chip and a first pair of diodes formed in the semiconductor chip. An anode contact and a cathode contact associated with each diode of said first pair of diodes is provided, where the anode contacts are formed in one side of the semiconductor chip, and the cathode contacts are formed in an opposite side of the semiconductor chip. A second pair of diodes is formed in the semiconductor chip. An anode contact and a cathode contact is associated with each diode of the second pair of diodes. The anode contacts of said second pair of diodes are formed in one side of the semiconductor chip, and the cathode contacts of the second pair of diodes are formed in an opposite side of the semiconductor chip. The anode contacts of the first pair of diodes are formed in a same side of the semiconductor chip, and the anode contacts of the second pair of diodes are formed in an opposite side of the semiconductor chip. The first pair of diodes and the second pair of diodes are connected to form a diode bridge, and an overvoltage protection device is formed in the semiconductor chip and connected to the diode bridge. A first resistor and a second resistor are formed in the semiconductor chip. The first resistor has one terminal connected to a cathode of the overvoltage protection device, and the other terminal of the first resistor is adapted for connection to an external first reference voltage. The second resistor has one terminal connected to an anode of the overvoltage protection device, and the other terminal of the second resistor is adapted for connection to an external second reference voltage.

According to yet another embodiment of the invention, disclosed is a method of forming an overvoltage protection circuit in a semiconductor substrate. The method includes forming a first resistor and a second resistor in the semiconductor substrate, and forming heavily doped regions in the first and second resistors. The heavily doped regions are adapted for forming metal contacts to said resistors. The method further includes forming a PN junction of a TVS device in one heavily doped region of the first resistor, whereby the TVS device is connected to a first terminal of the first resistor. A second terminal of the first resistor is formed so as to be electrically connected to a contact pad of the semiconductor substrate. A first terminal of the second resistor is connected to the TVS device. A diode bridge is formed in the semiconductor substrate, and the TVS device is connected to the diode bridge. The diode bridge, the resistors and the TVS device are encapsulated to form a packaged device.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, functions or elements throughout the views, and in which.

DETAILED DESCRIPTION OF THE INVENTION

Figure 1:
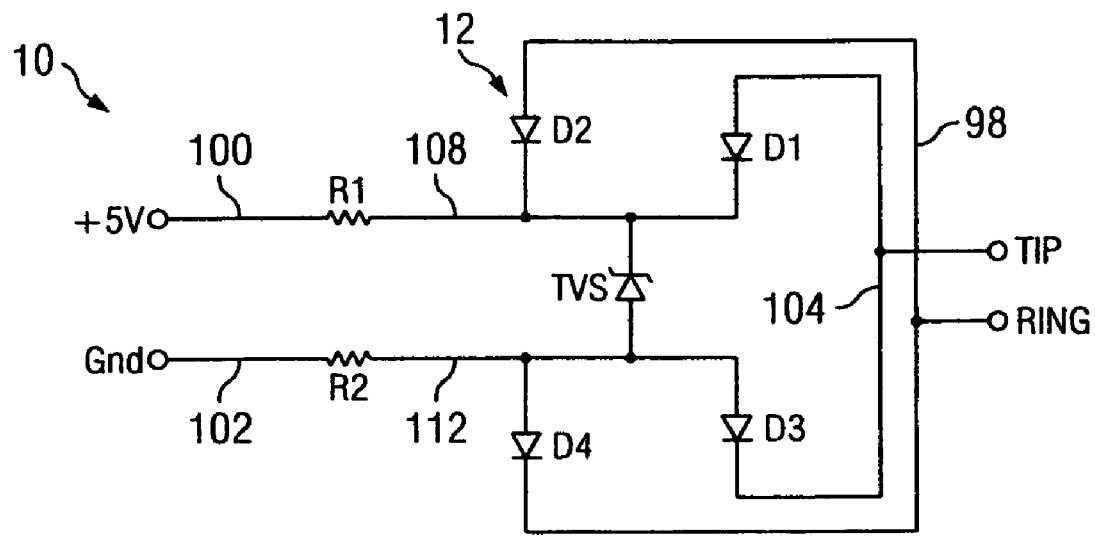
FIG. 1 illustrates in electrical schematic form the overvoltage protection circuit of an embodiment of the invention.

With reference now to FIG. 1, there is shown a schematic drawing of an overvoltage protection circuit 10 according to a preferred embodiment of the invention. The overvoltage protection circuit 10 includes a diode bridge 12, an overvoltage protection device in the form of a transient voltage suppressor (TVS), and a pair of resistors R1 and R2. The diode bridge 12 includes four diodes D1-D4 connected to the overvoltage protection TVS device. The overvoltage protection circuit 10 can be employed with communication line tip and ring circuits to protect the same from damage that overvoltages of either polarity would otherwise cause. Currents resulting from overvoltages on one line are safely carried to the other line and redirected from circuitry connected to either the tip or ring circuits. In other words, if a positive polarity overvoltage, greater than the reverse breakdown voltage or breakover voltage of the overvoltage protection TVS device is applied to the tip line, the resulting current will be conducted through the forward biased diode D1, through the conductive overvoltage protection TVS device in a reverse direction, through the forward biased diode D4 and to the ring line. Because of the rectification function performed by the diode bridge 12, the overvoltage protection TVS device need only be a unidirectional conducting device.

In accordance with an important feature of the invention, the overvoltage protection circuit 10 includes a pair of bias resistors R1 and R2 for connection to a source of bias voltage. The bias voltage is preferably of a magnitude greater than the voltages typically carried by the lines, but less than the breakover voltage or reverse breakdown voltage of the overvoltage protection TVS device. The bias voltage is applied through the resistors R1 and R2 across the overvoltage protection TVS device. The bias voltage is effective to reduce the junction capacitance of the overvoltage protection TVS device and allow the overvoltage protection circuit 10 to operate with high speed communication lines, such as Ethernet 10BaseT, 100BaseT or 1000BaseT lines. It is well known that when a bias voltage is impressed across a bipolar semiconductor device, the junction capacitance thereof is reduced. The bias voltage is envisioned to be about five volts when used with high speed Ethernet communication lines, in that the Ethernet signal amplitudes are on the order of about two volts. The overall capacitance of the overvoltage protection circuit 10 is further reduced by constructing the diodes D1-D4 as low capacitance devices. With this arrangement, the capacitance of the diodes D1 and D4 or D2 and D3, is in series with the capacitance of the overvoltage protection TVS device. This presents to the communication line an overall capacitance that is less than the smallest capacitance of that of the diodes or that of the overvoltage protection TVS device.

Figure 2:
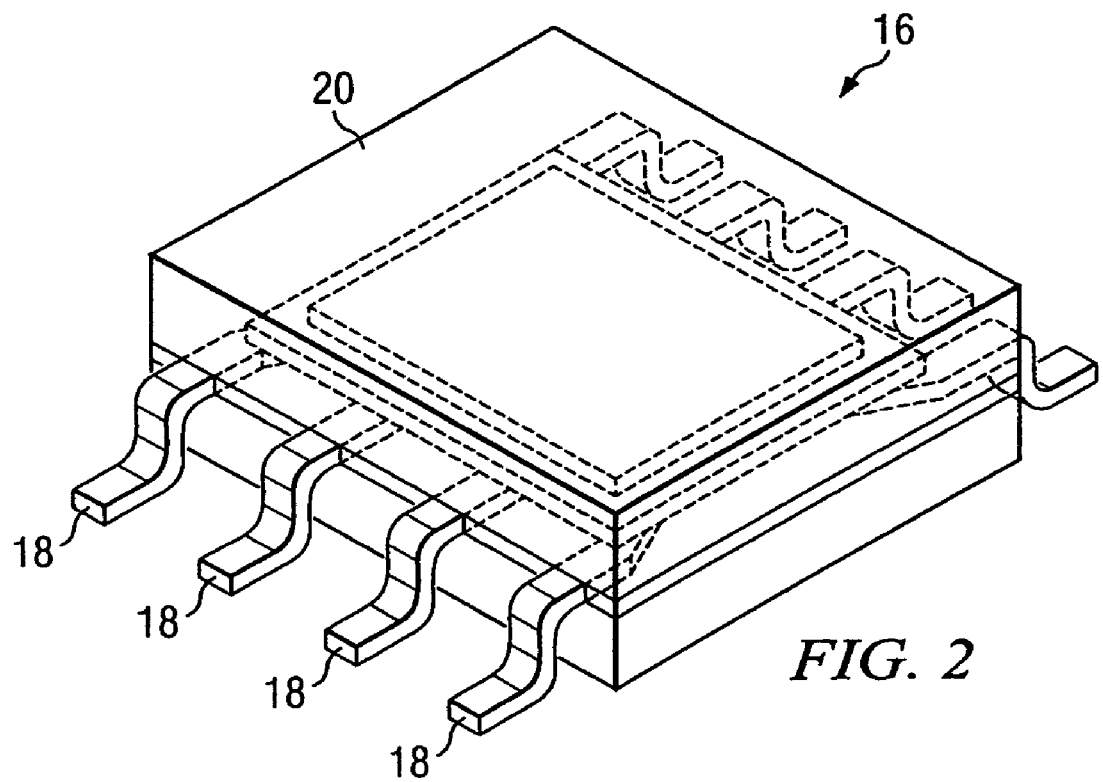
FIG. 2 is an isometric view of a packaged overvoltage protection circuit according to the invention.

In accordance with yet another feature of the invention, the overvoltage protection circuit 10 is fully integrated into a single semiconductor chip, thereby allowing smaller packages and more cost effective packaging techniques to be used and less space for providing overvoltage protection to communication lines. In the preferred embodiment of the invention, the overvoltage protection circuit 10 is envisioned to be packaged in an SO-8 package 16, such as shown in FIG. 2. However, the overvoltage protection circuit 10 can be packaged in many other types and styles of packages. According to JEDEC standards, the SO-8 package 16 is a low profile package which includes eight contact terminals, one shown as numeral 18. The integrated circuit embodying the overvoltage protection circuit 10 is soldered or otherwise electrically bonded to a lead frame having the contact terminals 18, and encapsulated with a suitable encapsulant 20 to provide mechanical protection to the integrated circuit. In the SO-8 package, the contact terminals 18 protrude outside the encapsulant 20 on opposing sides of the package 16, and can be soldered to corresponding spaced-apart contact pads of a printed circuit board, or the like.

Figure 3:
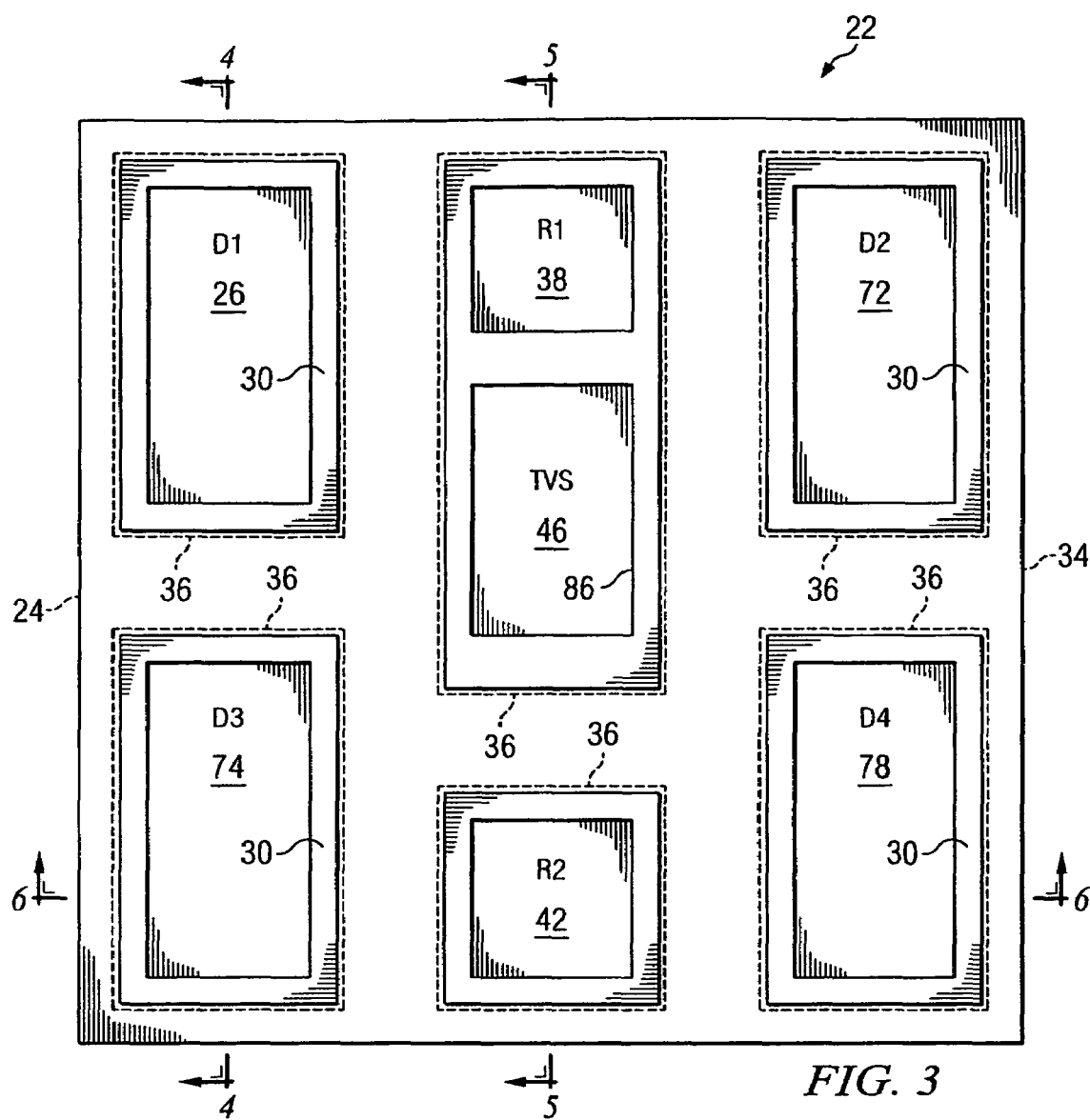
FIG. 3 is a top view of a semiconductor chip embodying the features of the invention.

An integrated circuit chip 22 constructed according to an embodiment of the invention is illustrated in FIG. 3. According to one embodiment, the size of the integrated circuit chip 22 is about 120×160 mils, and 10 mils thick. The placement of the various components of the overvoltage protection circuit 10 are indicated in the figure. In the construction of the overvoltage protection circuit 10, the diodes D1-D4 are constructed in a semiconductor substrate 24 from a top face thereof to a bottom face thereof. Rather than forming surface devices, the diodes D1-D4 are constructed through the semiconductor substrate 24 to provide higher current-carrying capabilities. In order to carry surge currents resulting from overvoltages, such as caused by lightning strikes to the communication lines, the diodes D1-D4, as well as the overvoltage protection device TVS, can preferably withstand short duration surge currents up to 100 amp, or more.

Figure 7:
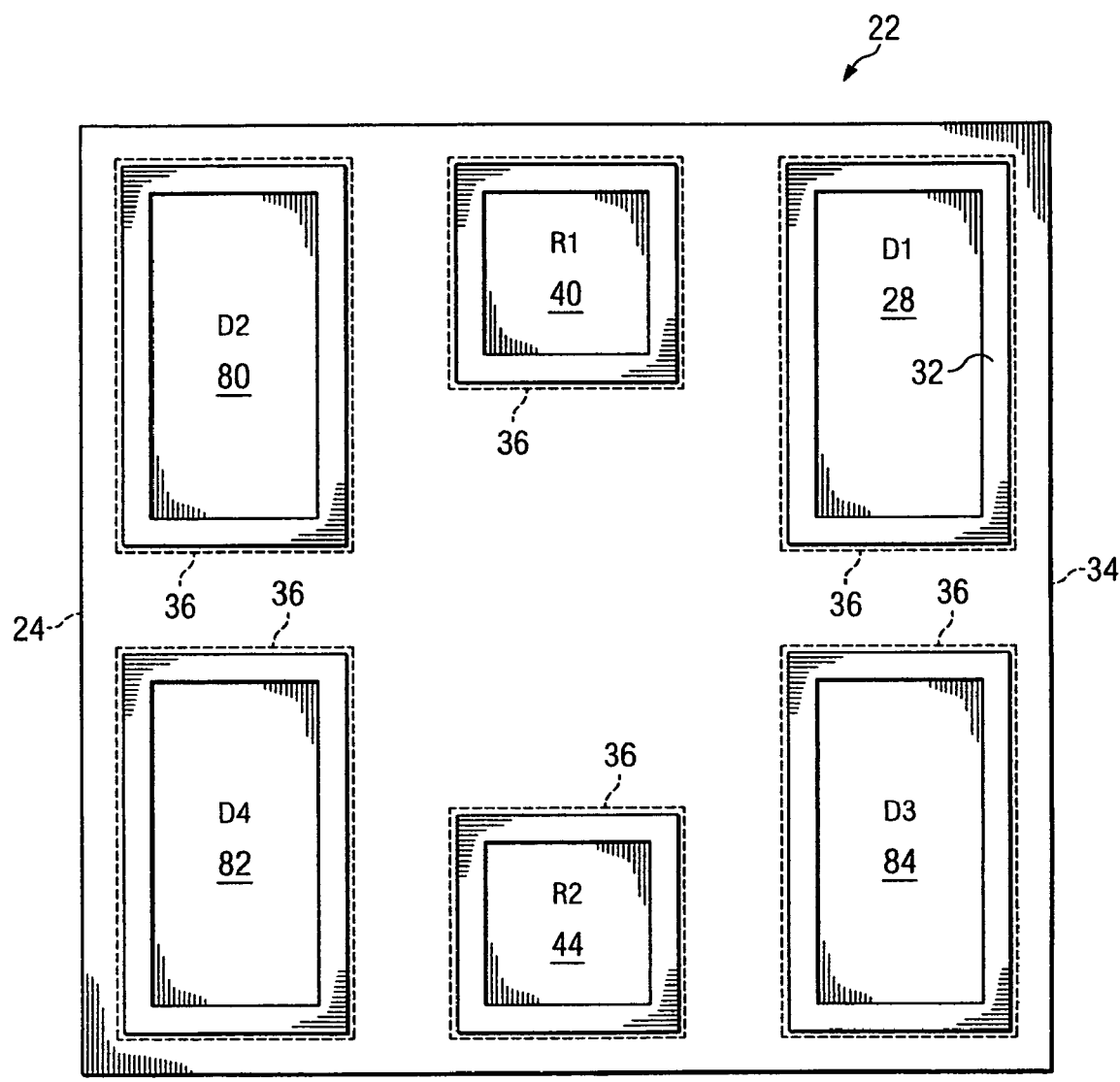
FIG. 7 is a bottom view of the integrated circuit chip of FIG. 3.

The top integrated circuit contact pads of the diodes D1-D4 are shown in FIG. 3, and the bottom contact pads of the chip 22 are shown in FIG. 7. In particular, the top metallic contact pad of diode D1 is identified by numeral 26, and the bottom metallic contact pad is identified by numeral 28. Surrounding the contact pad 26 on the top side of the integrated circuit chip 22 is the lip 30 of a glass passivation layer. A glass passivation layer formed on selected surfaces of the bottom of the chip 22 also forms a lip 32 around the bottom contact pad 28. While not shown in FIGS. 3 and 7, the glass passivation layer overlies a P+ isolation diffused region 34 of the semiconductor substrate 24 that serves to electrically isolate the various components from each other. The edge of the isolation diffused region 34 that surrounds each component in the substrate 24 is shown by broken line openings, such as the rectangular broken line 36 surrounding the diode D1. The same edge 36 of the isolation diffused region 34 is shown on the bottom of the chip 22 in FIG. 7. To that end, the isolation diffused region 34 extends from one face of the semiconductor substrate 24 to the other face of the substrate 24. The other diodes D2-D4 are formed from one face of the semiconductor substrate 24 to the other face of the semiconductor substrate 24, and are isolated and passivated in a similar manner. As will be described in more detail below, the cathodes of the diodes D1 and D2 are formed in one face of the semiconductor substrate 24, and the cathodes of diodes D3 and D4 are formed in the opposite face of the semiconductor substrate 24.

Formed through the semiconductor substrate 24 from one face to the opposite face of the semiconductor substrate 24 are the resistors R1 and R2. The resistance of the resistors R1 and R2 is determined by the cross-sectional area and thickness of the semiconductor substrate 24 through which the resistor current flows, and the resistivity of the semiconductor material forming the substrate 24. In the preferred embodiment, the resistance of each resistor is the same, and is in the range of about 100-500 ohm*cm. In the preferred form, the resistance of the resistors is about 200 ohm. The resistors R1 and R2 function to isolate the bias voltage supply from the communication lines. The resistors R1 and R2 are each constructed with top and bottom metallic contact pads. Resistor R1 includes a top contact pad 38 and bottom contact pad 40. Similarly, resistor R2 includes top contact pad 42 and bottom contact pad 44.

The overvoltage protection TVS device has only a single top contact pad 46 connected to the anode of the overvoltage protection TVS device. The cathode of the overvoltage protection TVS device is a semiconductor region connected to the resistor R1 within the integrated circuit chip 22. As will be described in more detail below, the overvoltage protection TVS device is a two layer, two-terminal avalanche junction device constructed with suitable doping levels in the anode and cathode regions to achieve a reverse breakdown voltage of about seven volts. It should be understood that other solid state overvoltage protection devices, including Sidactor devices, and thyristors can be employed according to the principles and concepts of the invention. In addition, while diodes are described in conjunction with the preferred embodiment of the invention, such diodes could be PN junctions of other devices formed in the semiconductor substrate.

Figure 4:
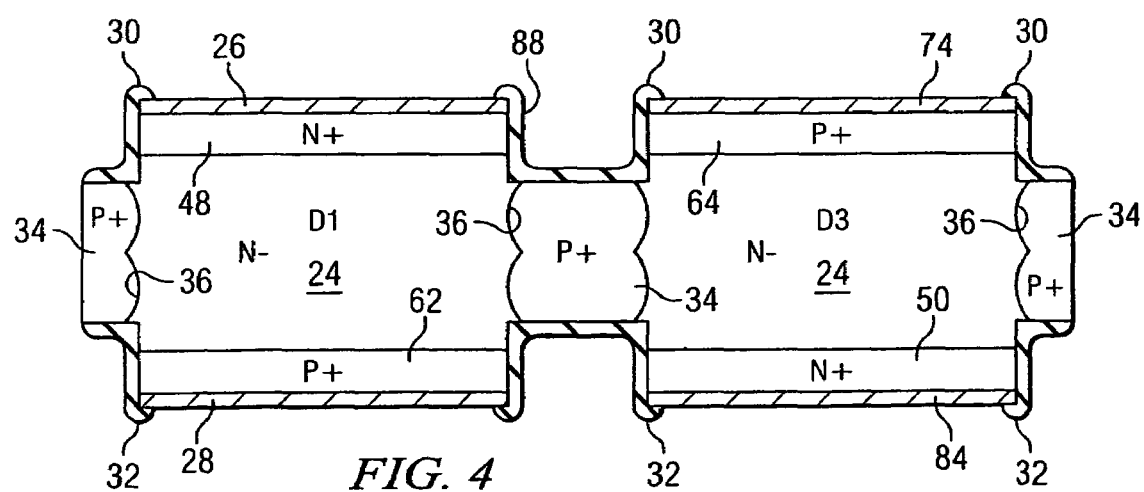
FIG. 4 is a cross-sectional view of the integrated circuit chip of FIG. 3, taken along line 4-4 thereof.

With reference to FIG. 4 of the drawings, there is illustrated a cross-sectional view of the semiconductor substrate 24, taken along line 4-4 of FIG. 3. This cross section of the substrate 24 illustrates the construction of the diodes D1 and D3. The starting semiconductor material is selected as a 50-ohm wafer (not shown) having a uniform N-doping throughout the wafer. The semiconductor substrate 24 or chip shown in FIG. 4 is one of many formed in the wafer.

The wafer is initially masked on both sides to define the areas of the semiconductor chip 22 where the P+ isolation diffusion is to be formed through the chip 22. The openings in the mask are then subjected to a deposition where a high dosage of a p-type impurity is deposited on the surface of the exposed semiconductor material. The wafer then undergoes a long duration diffusion drive process under high temperature conditions so that heavily doped P+ impurity is diffused into the wafer from both sides of the wafer. The P+ diffusion forms the isolation for electrically isolating the components in the semiconductor chip 22. The diffusion drive process is continued until the P+ impurity is driven into the wafer far enough to meet and overlap in the middle of the wafer, thus forming an hourglass shape. This is shown by the P+ diffused areas 34 shown in FIGS. 4-6. The edge 36 (FIG. 4) of the P+ diffused area 34 forms the broken line 36 shown in FIG. 3. The boundaries of the P+ diffused areas 34 are shown in broken lines around each of the components of FIGS. 3 and 7. The P+ diffused region extending all the way through the semiconductor substrate 24 forms a junction with the N− substrate 24 and thus provides the electrical isolation between the components, as noted above.

The semiconductor substrate 24 is masked on opposite sides thereof to define openings for forming the heavily doped N+ regions, such as the cathode 48 of diode D1 and the cathode 50 of diode D3. While not shown, the cathodes of the diodes D2 and D4 are formed in the semiconductor substrate 24 in a similar manner and at the same time. The cathodes of diodes D1 and D2 are formed in the top face of the semiconductor substrate 24, and the cathodes of the diodes D3 and D4 are simultaneously formed in the bottom face of the semiconductor substrate 24.

Figure 5:
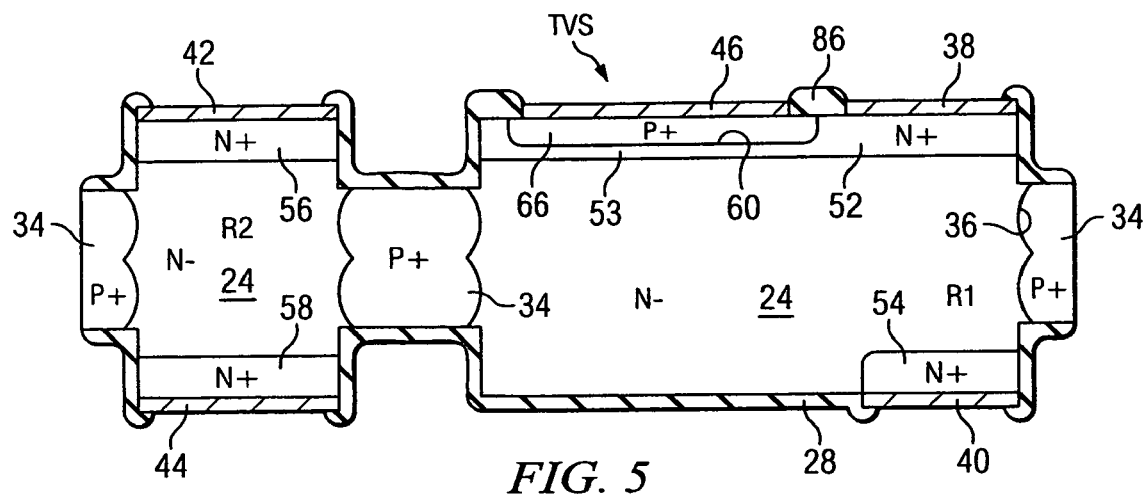
FIG. 5 is a cross-sectional view of the integrated circuit chip of FIG. 3, taken along line 5-5 thereof.

The mask also includes openings for forming N+ regions 52 and 54 shown in FIG. 5. These heavily doped semiconductor regions facilitate the formation of metal contacts to the resistor R1. The metal employed is a nickel, although other metals could be used. The N+ regions 52 and 54 are formed at the same time as the other diode cathode regions 48 and 50 for diodes D1-D4. The N-type dopant can be phosphorus or any other suitable dopant. Lastly, the N+ regions 56 and 58 are formed in opposite faces of the semiconductor substrate 24 for providing heavily doped interfaces to resistor R2 for forming metal contacts thereon.

As can be seen from FIG. 5, the cathode 53 of the overvoltage protection TVS device is formed as part of the region 52. However, since the N+ region 52 is formed deeper than the other N+ regions of the semiconductor substrate 24, it is first masked to undergo a process to diffuse the N+ impurity into the region identified by 52 and 53. The N+ region 52 and 53 is deeper than the other N+ regions because the P+ anode of the overvoltage protection TVS device is formed in a portion thereof. Subsequently, the region identified by 52 and 53 undergoes a second diffusion when the other N+ regions of the semiconductor substrate 24 are formed, as described above. As a result, the region 52 and 53 is formed deeper in the semiconductor substrate 24 than the other N+ regions.

The cathode/contact interface mask is removed from each side of the wafer, and an anode mask is applied to the wafer. This mask is etched to define openings for forming the anodes of the diodes D1-D4, as well as for forming the anode for the overvoltage protection TVS device. The anodes of the diodes D1-D4 are formed in the lightly doped N− substrate 24, while the TVS anode 66 is formed in the N+ region 53 of the semiconductor substrate 24. A boron or gallium dopant, or other suitable dopant, can be used as the P-type impurity. The concentration of the N-type impurity and the P-type impurity are selected to achieve a junction 60 having a reverse breakdown voltage of about seven volts. The diffusion process in which the P-type dopant is driven into the mask openings also forms the P+ region 62 for diode D1 (FIG. 4) and the P+ region 64 for diode D3. While not shown, the P+ anode regions of the corresponding diodes D2 and D4 are formed. The anodes of diodes D1 and D2 are formed in the same face of the semiconductor substrate 24, and the anodes of diodes D3 and D4 are formed in the opposite face of the semiconductor substrate 24. In addition to the formation of the diode anodes using the heavily doped P+ impurity, the heavily doped P+ surface of the regions provides an excellent interface for forming nickel contacts to the diode anodes.

Figure 6:
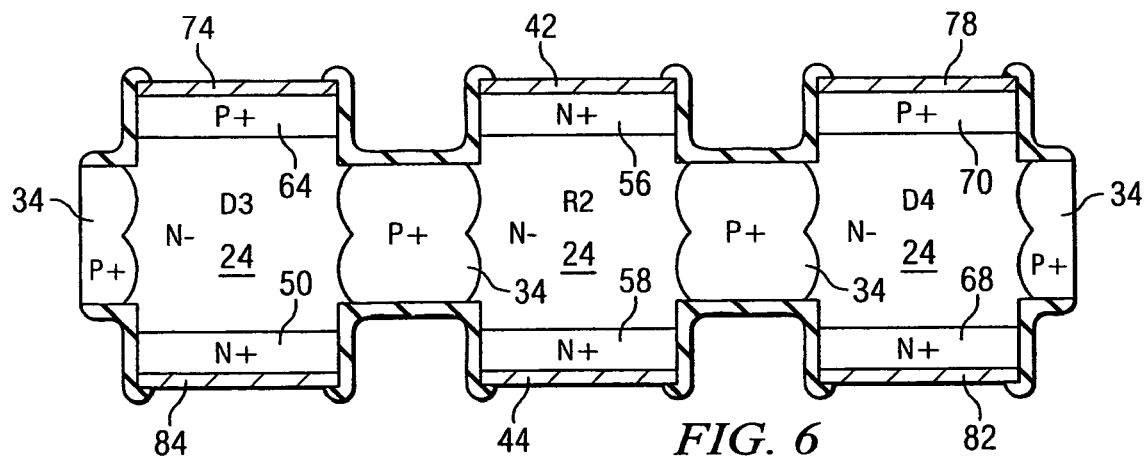
FIG. 6 is a cross-sectional view of the integrated circuit chip of FIG. 3, taken along line 6-6 thereof.

FIG. 6 is a cross-sectional view through the semiconductor substrate 24, taken along line 6-6 of FIG. 3. The cross section of the diode D3 is the same as that shown in FIG. 4, and the cross section of the resistor R2 is the same as that shown in FIG. 5. As noted above, the diodes D3 and D4 are constructed in an identical manner, with the N+ cathodes 50 and 68 formed in the bottom face of the semiconductor substrate 24, and the P+ anodes 64 and 70 formed in the top face of the semiconductor substrate 24.

The wafer is then subjected to an oxidizing environment in which the surfaces of the semiconductor material oxidize and form a silicon oxide. The silicon oxide is masked and etched to form openings that define those areas where a grid network, or trenches, are to be formed. The trenches form the grid structure between each of the chips 22 of the wafer, as well as between the components formed on each chip 22. The grid structure is formed by etching the wafer in the unmasked grid areas down into the semiconductor material of the chip 22. The chip 22 is etched down through the heavily doped P+ and N+ regions into the lightly doped N− substrate 24. The grid structure forms trenches in the semiconductor material, on both sides of the wafer. The trenches are shown in the cross-sectional views of FIGS. 4-6.

The exposed surfaces of the top and bottom trenches of the semiconductor chip 22 are then passivated with a glass passivation material. A standard leadaluminoborosilicate glass insulating and passivating material is preferred. The passivation seals the edges of the various semiconductor regions exposed by the trenches. The passivation covering the surface of the center top trench in FIG. 4 is identified as numeral 88, it being understood that all of the top and bottom trenches are passivated in the same manner. During the passivation process, the glass material forms a lip on the top corner of the silicon oxide mask. The lip is shown as reference numeral 30 in FIG. 4, and is shown as cross-hatched rectangular rings in FIGS. 3 and 7. An annular-shaped glass passivation 86 is formed over the junction defined by the P+ region 66 and the N+ region 53 of the TVS device, as shown in FIG. 5. After the glass passivating step, the silicon oxide mask is stripped with a suitable etchant.

In the next step of the processing of the semiconductor substrate 24, metal contacts are formed on both surfaces of the semiconductor chip 22. The top metal contact areas formed on the top of the semiconductor substrate 24 are shown in FIG. 3 as top diode contact pads 26 (D1), 72 (D2), 74 (D3) and 78 (D4). The top contacts of resistors R1 and R2 include contact pads 38 (R1) and 42 (R2). The top contact pad for the overvoltage protection TVS device is shown as numeral 46. The bottom metal contact areas formed on the bottom of the semiconductor substrate 24 are shown in FIG. 7 as bottom diode contact pads 28 (D1), 80 (D2), 84 (D3) and 82 (D4). The bottom contacts of resistors R1 and R2 include contact pads 40 (R1) and 44 (R2). There is no bottom metal contact for the overvoltage protection TVS device. The metal contacts are formed on the various heavily doped P+ and N+ regions by plating or depositing a nickel metal over the surface of the semiconductor chip 22. The nickel metal does not adhere to the glass passivation areas, but only to the remaining semiconductor areas defining the contact areas. The metal is selected as a nickel material and deposited or plated by conventional semiconductor processing methods. The various metal contacts are also shown in FIGS. 4-6. The wafer is then scribed and broken around each chip 22 to separate the wafer into the individual semiconductor chips 22.

Figure 8:
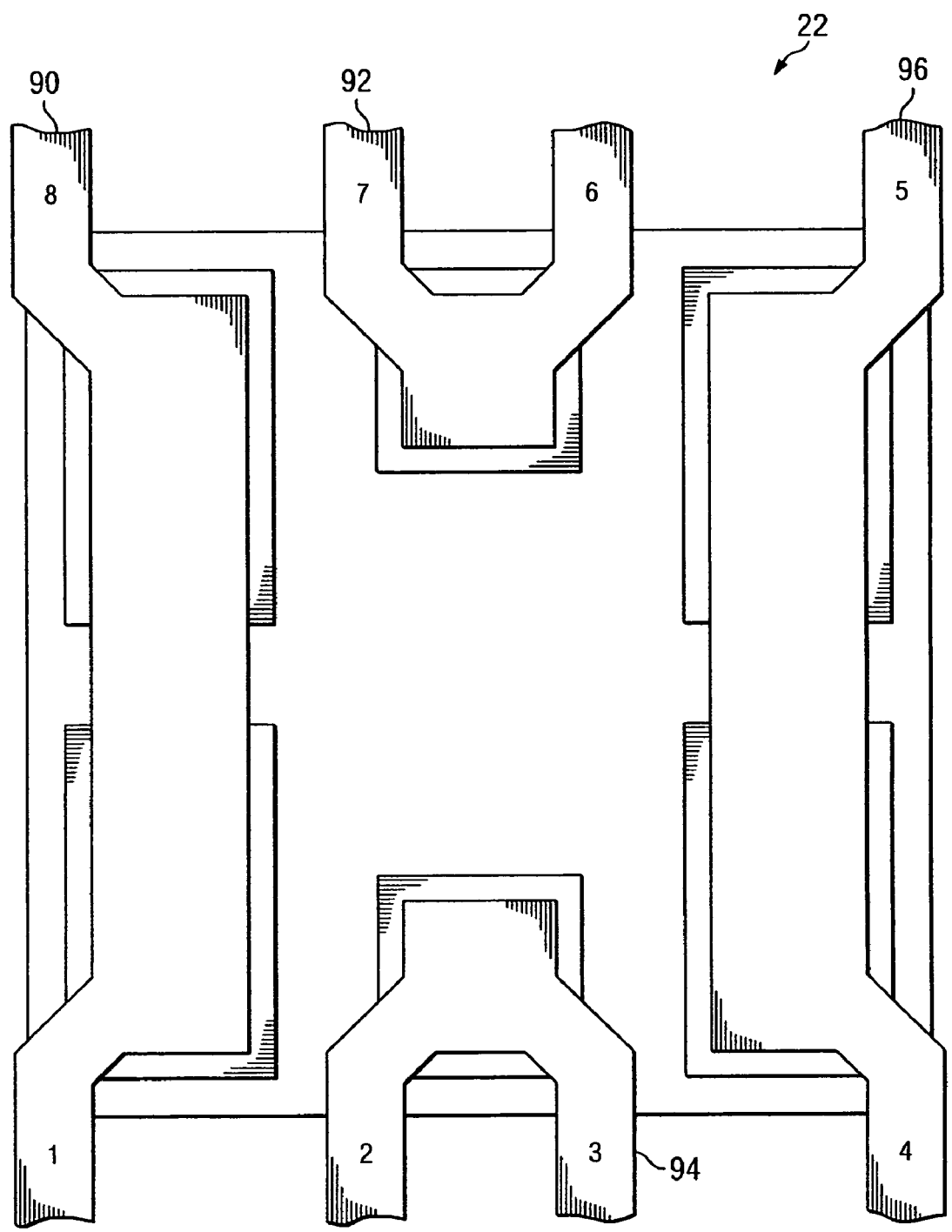
FIG. 8 illustrates a bottom view of the integrated circuit chip, showing the connection of the bottom contact pads to lead frame members.
Figure 9:
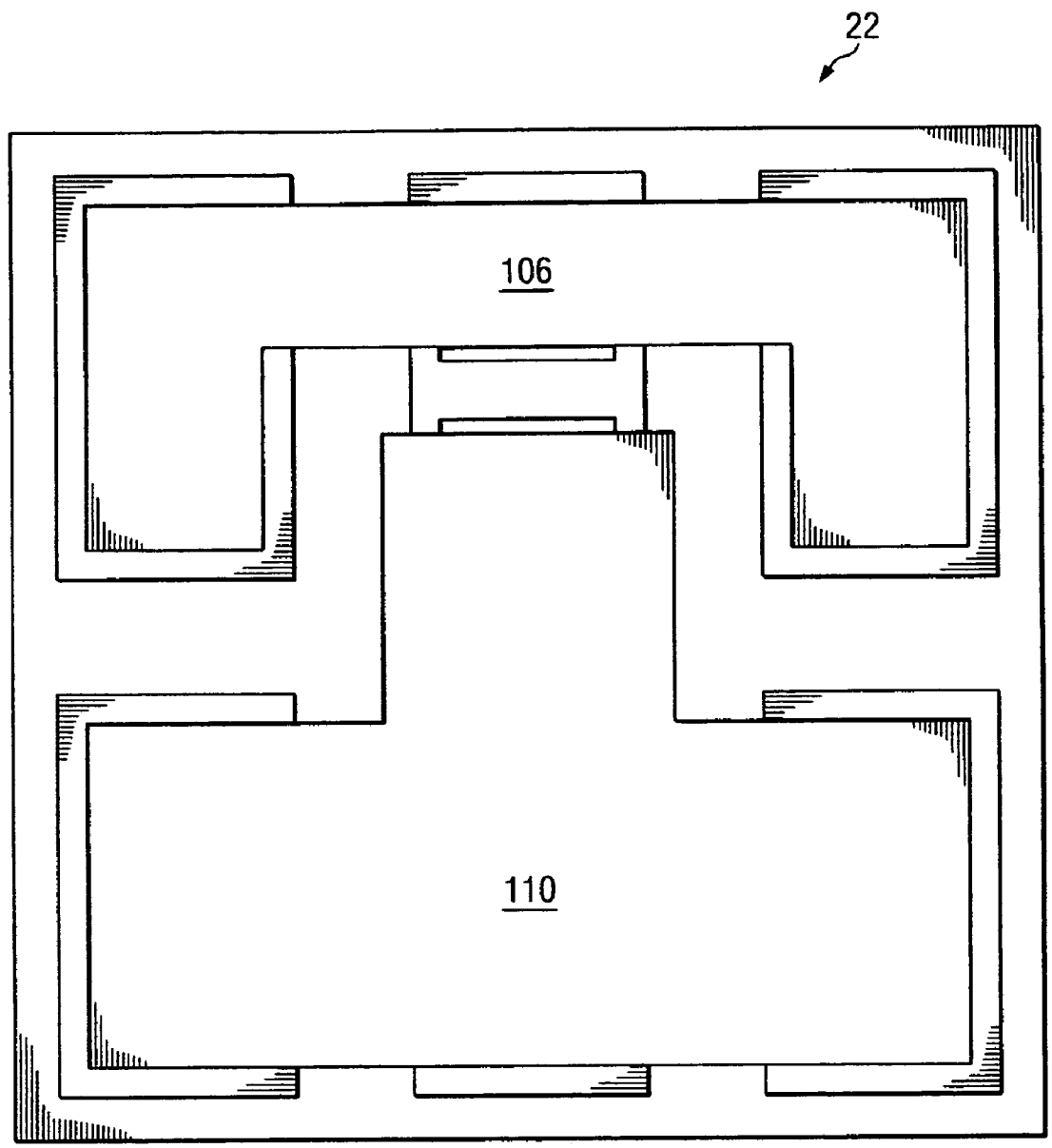
FIG. 9 illustrates a top view of the integrated circuit chip with preform members interconnecting the top contact pads of the integrated circuit.

The individual chip 22 embodying the overvoltage protection circuit 10 of the invention is soldered to lead frame members. Metal preforms are also attached to the various contact pads of the chip 22 to provide the interconnections between the components thereof. This is shown in FIG. 8 and FIG. 9. Initially, a solder paste is applied to the top and bottom contact pads of the semiconductor chip 22.

The bottom of the semiconductor chip 22 is shown in FIG. 7, and in FIG. 8 as attached to the lead frame members. Lead frame member 90 is soldered to the bottom contact pads 80 and 82 of respective diodes D2 and D4, thereby short circuiting the anode of diode D2 to the cathode of diode D4. This is the conductor 98 shown in FIG. 1. Lead frame member 92 is attached to the bottom contact pad 40 of the resistor R1. Lead frame member 92 defines conductor 100 shown in FIG. 1. Lead frame member 94 is attached to the bottom contact pad 44 of resistor R2. This lead frame member 94 defines the conductor 102 of FIG. 1. Lastly, the bottom contact pads 28 and 84 of diodes D1 and D3 are attached to lead frame member 96. Lead frame member 96 defines the conductor 104 of FIG. 1 connecting the anode of diode D1 to the cathode of diode D3.

The contact terminal numbers of the lead frame members are shown in FIG. 8, as would be used when packaged in an SO-8 package. Either or both of contact terminals 1 and 8 could be connected to a tip line conductor of a communication line. Either or both of contact terminals 4 or 5 could be connected to a ring conductor of a communication line. One or both of contact terminals 6 and 7 could be connected to the positive terminal of a bias voltage supply. Lastly, one or both of contact terminals 2 and 3 could be connected to a ground terminal of the bias voltage supply.

The other interconnections between to the contact pads of the semiconductor chip 22 to form the circuit shown in FIG. 1 are made by using metal preforms, as shown in FIG. 9. The metal preforms are attached to the top contact pads of the semiconductor chip 22. Metal preform 106 is attached to contact pads 26 (D1), 38 (R1) and 72 (D2). The metal preform 106 effectively defines the conductor 108 of the circuit of FIG. 1. The metal preform 110 is attached to the top contact pads 74 (D3), 46 (TVS), 42 (R2) and 78 (D4). The metal preform 110 effectively defines the conductor 112 of FIG. 1. Once the semiconductor chip 22 is fastened to the lead frame members and the metal preforms, the assembly undergoes a reflow solder process for soldering the top and bottom contact pads to the respective metal preforms and lead frame members. The contacts terminal of the lead frame are then severed from the lead frame carrier and bent to the configuration conforming to the SO-8 package. The packaged chip is then removed from the lead frame carrier and tested for functionality.

From the foregoing, disclosed is a technique, and corresponding integrated circuit chip, that incorporates an overvoltage protection circuit in a small package. High current-carrying diodes are fabricated between faces of a semiconductor substrate, with two diode cathodes formed in one face, and two diode anodes formed in an opposite face of the semiconductor substrate. A high current TVS device is formed as a surface device, with one terminal connected to a metal contact, and the other terminal connected internally to a bias resistor. The bias resistors are formed as doped semiconductor regions, and are adapted for connection to a bias voltage source to reduce the junction capacitance of the TVS device. The entire overvoltage protection circuit is integrated into a single semiconductor chip, and packaged to provide a cost effective overvoltage protection device.

While the preferred and other embodiments of the invention have been disclosed with reference to specific circuit, semiconductor structure and packaged device, it is to be understood that many changes in detail may be made as a matter of engineering choices without departing from the spirit and scope of the invention, as defined by the appended claims.

What is claimed is:

1. An overvoltage protection circuit, comprising:
a reference voltage and a different reference voltage;
a first pair of diodes with cathodes thereof connected together to form a first circuit junction, and a second pair of diodes with anodes thereof connected together to form a second circuit junction, said first and second pairs of diodes defining a bridge circuit;
an overvoltage protection device connected between said first circuit junction and said second circuit junction, said overvoltage protection device having a characteristic breakover voltage when biased in a reverse direction;
a first resistor having one terminal connected to said first circuit junction, and another terminal of said first resistor adapted for connection to said reference voltage;
a second resistor having one terminal connected to said second circuit junction, and another terminal of said second resistor adapted for connection to said different reference voltage;
a difference between a voltage of said reference voltage and a voltage of said different reference voltage is less than the breakover voltage of said overvoltage protection device;
whereby said reference voltage is effective to reduce a capacitance of said overvoltage protection device; and
said first and second diode pairs, said overvoltage protection circuit, and said first and second resistors are formed in a single semiconductor chip.

2. The overvoltage protection circuit of claim 1, wherein one said reference voltage or said different reference voltage comprises a non-zero voltage, and the other of said reference voltage or said different reference voltage comprises a ground.

3. The overvoltage protection circuit of claim 2, wherein said non-zero voltage comprises a positive polarity voltage.

4. The overvoltage protection circuit of claim 1, wherein said semiconductor chip includes a first contact terminal for connecting the reference voltage to said another terminal of said first resistor, and a second contact terminal for connecting the different reference voltage to said another terminal of said second resistor.

5. The overvoltage protection circuit of claim 1, wherein said semiconductor chip includes a plurality of contact terminals, a first contact terminal adapted for connection to a telephone line tip conductor, a second contact terminal adapted for connection to a telephone line ring conductor, a third contact terminal adapted for connecting the reference voltage to said first resistor, and a fourth contact terminal adapted for connecting the different reference voltage to said second resistor.

6. The overvoltage protection circuit of claim 1, wherein one said first or second resistor is connected internally in said semiconductor chip to said overvoltage protection device.

7. The overvoltage protection circuit of claim 1, wherein said first and second resistors each have a resistance in the range of about 100-500 ohm.

8. The overvoltage protection circuit of claim 1, wherein said first resistor and said second resistor extend from one face of said semiconductor chip to an opposite face of said semiconductor chip.

9. The overvoltage protection circuit of claim 8, wherein a resistance of said first and second resistors comprises a bulk resistance of a substrate of said semiconductor chip.

10. The overvoltage protection circuit of claim 1, wherein said overvoltage protection device is a two-terminal avalanche device.

11. The overvoltage protection circuit of claim 10, wherein said avalanche device is a PN junction doped to provide a breakdown voltage of about seven volts.

12. The overvoltage protection circuit of claim 1, wherein said circuit includes a contact pad for connection to a voltage source, a contact pad for connection to a ground, a contact pad for connection to a tip conductor of a communication line, and a contact pad for connection to a ring conductor of the communication line.

13. The overvoltage protection circuit of claim 1, further including a lead frame to which one side of said semiconductor chip is bonded, and a plurality of preforms for shorting together various semiconductor regions on an opposite side of said semiconductor chip, and wherein
a first preform of said plurality of preforms connecting the cathodes together of said first pair of diodes and said one terminal of said first resistor;
a second preform of said plurality of preforms connecting the anodes together of said second pair of diodes and said one terminal of said second resistor and a terminal of said overvoltage protection device;
and wherein said first pair of diodes includes a first diode and a second diode, and said second pair of diodes includes a first diode and a second diode;
said lead frame having a first member connecting together an anode of said first diode of said first pair of diodes and a cathode of said first diode of said second pair of diodes; and
said lead frame having a second member connecting together an anode of said second diode of said first pair of diodes and a cathode of said second diode of said second pair of diodes.

14. The overvoltage protection circuit of claim 13, further including an encapsulant for encapsulating said semiconductor chip and said preforms and at least a portion of said lead frame.

15. An overvoltage protection circuit, comprising:
a semiconductor chip, said semiconductor chip having a first surface into which impurities are diffused to form semiconductor devices, and an opposite surface into which impurities are diffused to form semiconductor devices;
a first pair of diodes formed in said semiconductor chip;
an anode contact and a cathode contact associated with each diode of said first pair of diodes, said anode contacts formed during semiconductor processing of said semiconductor chip, said anode contacts formed on said first surface of said semiconductor chip, and said cathode contacts formed during semiconductor processing of said semiconductor chip, said cathode contacts formed on said second surface of said semiconductor chip;
a first metal conductor connecting said cathode contacts together;
a second pair of diodes formed in said semiconductor chip;
an anode contact and a cathode contact associated with each diode of said second pair of diodes, said anode contacts of said second pair of diodes formed during semiconductor processing of said semiconductor chip, said anode contacts of said second pair of diodes formed on said second surface of said semiconductor chip, and said cathode contacts of said second pair of diodes formed during semiconductor processing of said semiconductor chip, said cathode contacts of said second pair of diodes formed on said first surface of said semiconductor chip;
a second metal conductor connecting the anode contacts of said second pair of diodes together;
said first pair of diodes and said second pair of diodes connected to form a diode bridge; and
an overvoltage protection device formed in said semiconductor chip and connected to said diode bridge between said first and second conductors.

16. The overvoltage protection circuit of claim 15, further including a first resistor and a second resistor formed in said semiconductor chip, said first resistor having one terminal connected to a cathode of said overvoltage protection device, and the other terminal of said first resistor adapted for connection to an external first reference voltage, and said second resistor having one terminal connected to an anode of said overvoltage protection device, and the other terminal of said second resistor adapted for connection to an external second reference voltage.

17. A method of forming an overvoltage protection circuit in a semiconductor substrate, comprising the steps of:
forming a first resistor and a second resistor in the semiconductor substrate, and forming heavily doped regions in said first and second resistors, said heavily doped regions adapted for forming metal contacts to said resistors;
forming a PN junction of a TVS device in one heavily doped region of said first resistor, whereby said TVS device is connected to a first terminal of said first resistor;
forming a second terminal of said first resistor so as to be electrically connected to a contact pad of said semiconductor substrate;
connecting a second terminal of said second resistor to said TVS device;
forming a diode bridge in said semiconductor substrate, and connecting said TVS device to said diode bridge; and
encapsulating the diode bridge, the resistors and the TVS device to form a packaged device.

18. The method of claim 17, further including forming the diodes of the bridge so that a cathode of each diode is formed in one face of the semiconductor substrate, and an anode of each diode is formed in an opposite face of the semiconductor substrate.

19. The method of claim 17, further including forming each said first and second resistor from one face of said semiconductor substrate to an opposite face of said semiconductor substrate.

20. The method of claim 17, further including forming four different contact terminals for said packaged device, where each said terminal provides a different function.

21. The method of claim 17, further including forming said TVS device with a cathode and an anode formed in the same face of said semiconductor substrate.

* * * * *